(12) United States Patent
Kondo et al.

(10) Patent No.: US 11,506,290 B2
(45) Date of Patent: Nov. 22, 2022

(54) VALVE APPARATUS, FLOW RATE ADJUSTING METHOD, FLUID CONTROL APPARATUS, FLOW RATE CONTROL METHOD, SEMICONDUCTOR MANUFACTURING APPARATUS, AND SEMICONDUCTOR MANUFACTURING METHOD

(71) Applicant: FUJIKIN INCORPORATED, Osaka (JP)

(72) Inventors: Kenta Kondo, Osaka (JP); Toshihide Yoshida, Osaka (JP); Kenji Aikawa, Osaka (JP); Hidenobu Sato, Osaka (JP); Tomohiro Nakata, Osaka (JP); Tsutomu Shinohara, Osaka (JP); Masahiko Takimoto, Osaka (JP)

(73) Assignee: FUJIKIN INCORPORATED, Osaka (JP)

( * ) Notice: Subject to any disclaimer, the term of this patent is extended or adjusted under 35 U.S.C. 154(b) by 150 days.

(21) Appl. No.: 16/647,560

(22) PCT Filed: Sep. 11, 2018

(86) PCT No.: PCT/JP2018/033596
§ 371 (c)(1),
(2) Date: Mar. 16, 2020

(87) PCT Pub. No.: WO2019/059043
PCT Pub. Date: Mar. 28, 2019

(65) Prior Publication Data
US 2020/0278033 A1    Sep. 3, 2020

(30) Foreign Application Priority Data
Sep. 25, 2017 (JP) .............................. JP2017-183638

(51) Int. Cl.
*F16K 1/52* (2006.01)
*C23C 16/455* (2006.01)
(Continued)

(52) U.S. Cl.
CPC .......... *F16K 1/52* (2013.01); *C23C 16/45544* (2013.01); *F16K 31/1221* (2013.01); *H01L 21/67017* (2013.01)

(58) Field of Classification Search
CPC .. F16K 31/1221; F16K 31/005; F16K 31/007; F16K 31/008; F16K 1/52; G01D 5/185; H01L 41/083
See application file for complete search history.

(56) References Cited

U.S. PATENT DOCUMENTS

| | | | | |
|---|---|---|---|---|
| 5,092,360 A | * | 3/1992 | Watanabe | F16K 31/007 137/487.5 |
| 8,783,652 B2 | * | 7/2014 | Dinh | H01L 21/02104 251/129.06 |

(Continued)

FOREIGN PATENT DOCUMENTS

| | | |
|---|---|---|
| JP | S62-288782 A | 12/1987 |
| JP | 7-83351 | 3/1995 |

(Continued)

OTHER PUBLICATIONS

English Machine Translation of JPH0762502B2; Retrieved from ESPACENET on Sep. 29, 2021. (Year: 1986).*

(Continued)

*Primary Examiner* — Reinaldo Sanchez-Medina
*Assistant Examiner* — Nicole Gardner
(74) *Attorney, Agent, or Firm* — Greenblum & Bernstein, P.L.C.

(57) ABSTRACT

A valve device is capable of precisely adjusting a flow rate variation due to aging, aging, etc. without using an external (Continued)

sensor. An adjusting actuator includes a piezoelectric element for adjusting the position of the operating member positioned at the open position, and the drive circuit of the adjusting actuator includes a detecting unit for detecting an electric signal related to the amount of strain generated in the piezoelectric element, and a control unit for controlling the adjusting actuator so that the opening degree of the flow path by the valve element becomes the target opening degree based on the electric signal related to the amount of strain of the piezoelectric element.

4 Claims, 12 Drawing Sheets

(51) Int. Cl.
*F16K 31/122* (2006.01)
*H01L 21/67* (2006.01)

(56) References Cited

U.S. PATENT DOCUMENTS

| | | | | |
|---|---|---|---|---|
| 11,022,224 | B2* | 6/2021 | Yoshida | F16K 31/007 |
| 11,098,819 | B2* | 8/2021 | Yoshida | F16K 7/17 |
| 2001/0038083 | A1* | 11/2001 | Sakurai | F16K 31/007 |
| | | | | 251/129.06 |
| 2002/0017833 | A1* | 2/2002 | Montuschi | F02M 63/0031 |
| | | | | 310/328 |
| 2005/0253100 | A1 | 11/2005 | Yasue et al. | |
| 2010/0127196 | A1* | 5/2010 | Sawada | F16K 31/007 |
| | | | | 251/129.06 |
| 2013/0000759 | A1* | 1/2013 | Killeen | F04B 43/046 |
| | | | | 137/565.16 |
| 2013/0233395 | A1 | 9/2013 | Dinh et al. | |

FOREIGN PATENT DOCUMENTS

| | | |
|---|---|---|
| JP | 2007-64333 | 3/2007 |
| JP | 2013-210095 | 10/2013 |
| JP | 2016-121776 | 7/2016 |
| WO | 2004/079243 | 9/2004 |
| WO | 2018/088326 | 5/2018 |

OTHER PUBLICATIONS

Chinese Office Action, Chinese Patent Office, Application No. 201880062388.4, dated Jul. 1, 2021, with English translation.
International SearchReport issued in International Patent Application No. PCT/JP2018/033596, dated Dec. 11, 2018, English translation.
International Preliminary Report on Patentability issued in International Patent Application No. PCT/JP2018/033596, dated Mar. 31, 2020, English translation.

* cited by examiner

[fig.1]
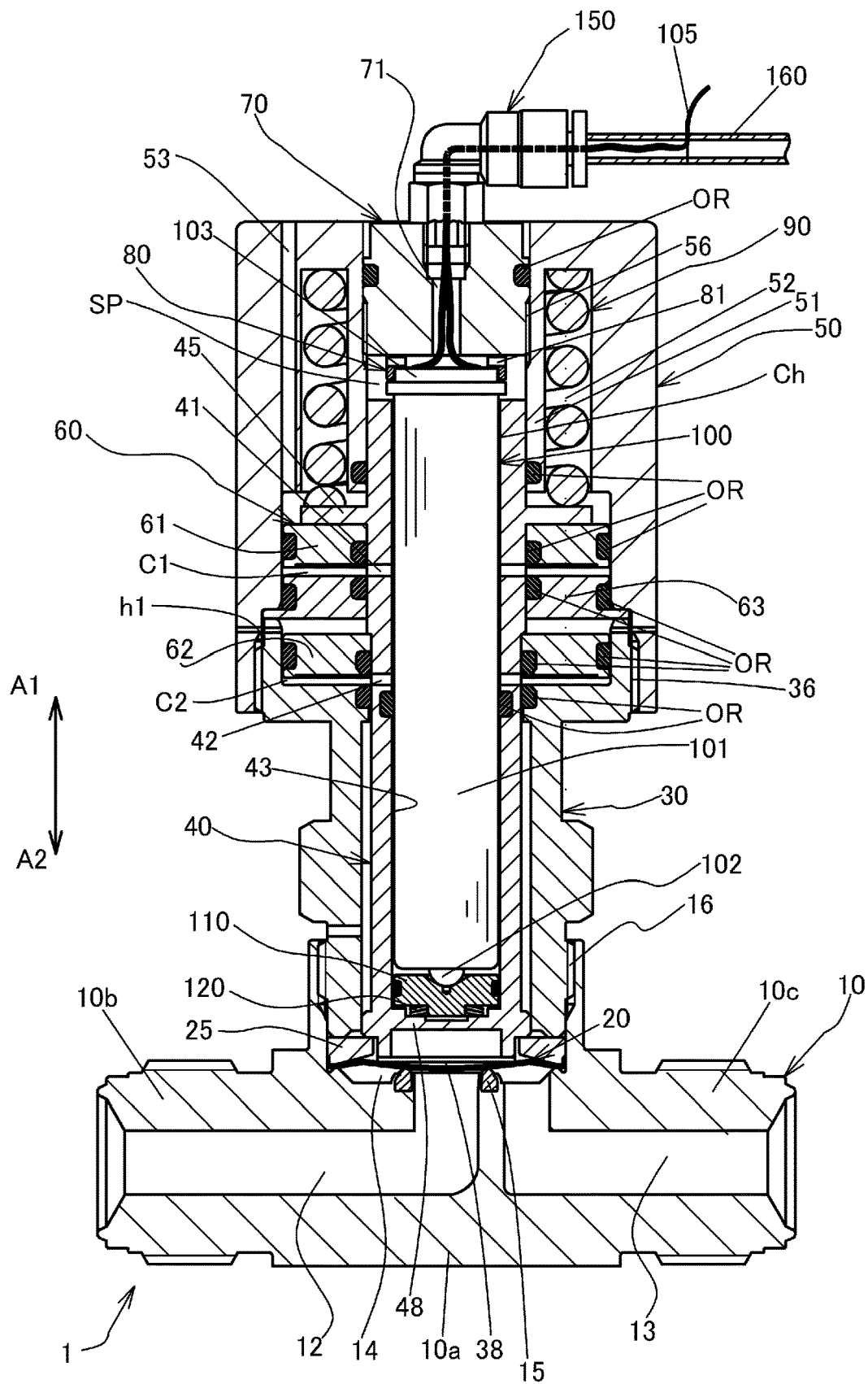

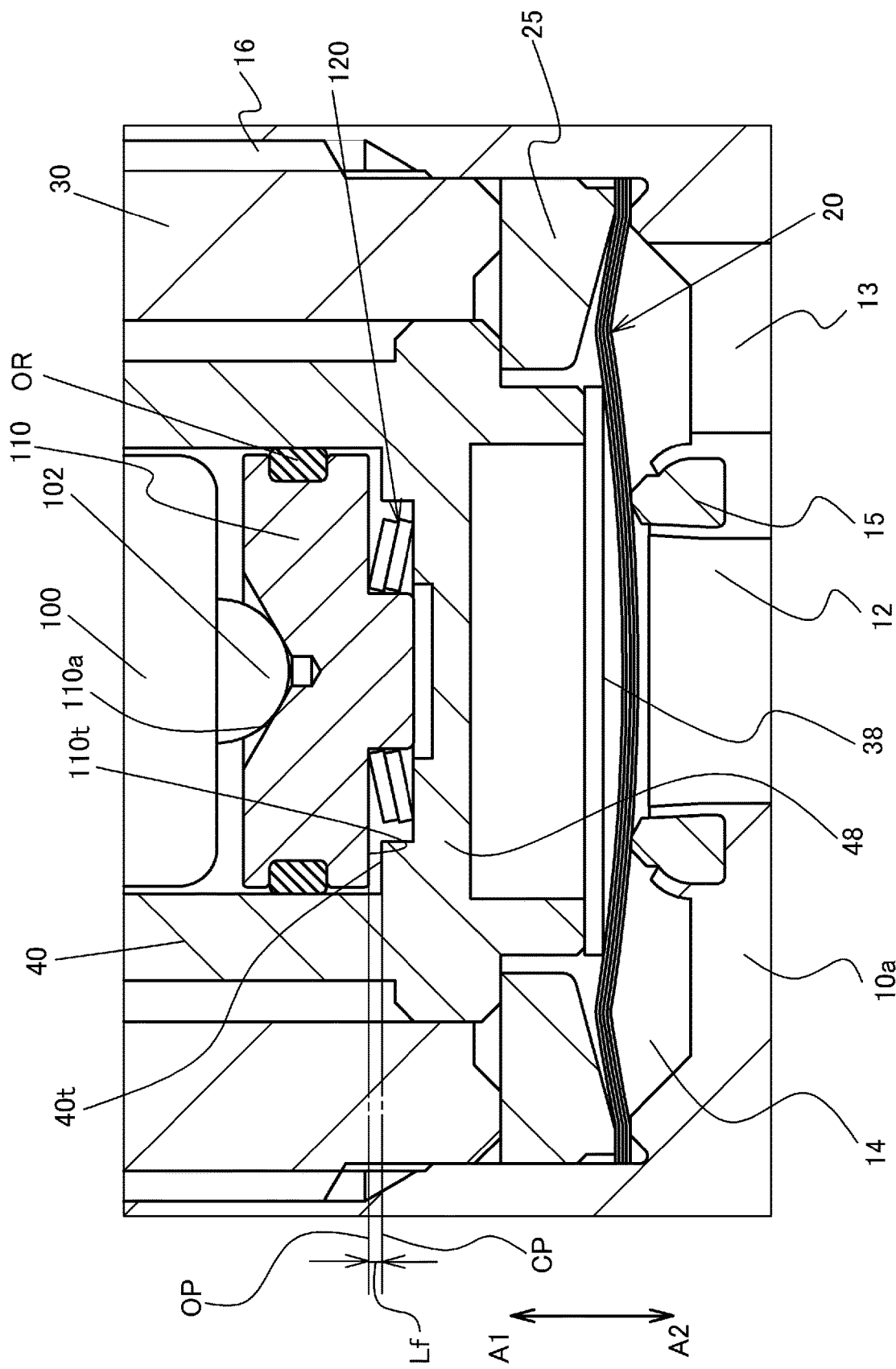
[fig.2]

[fig.3]
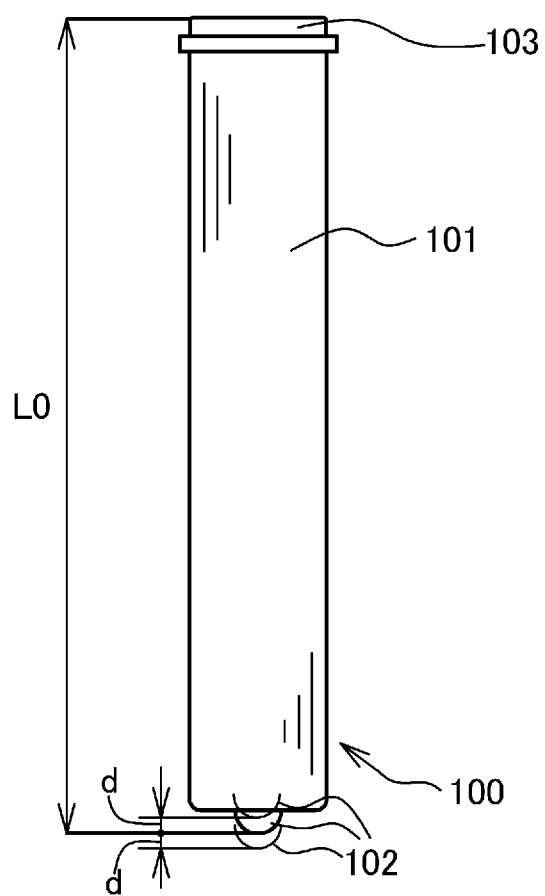

[fig.4]
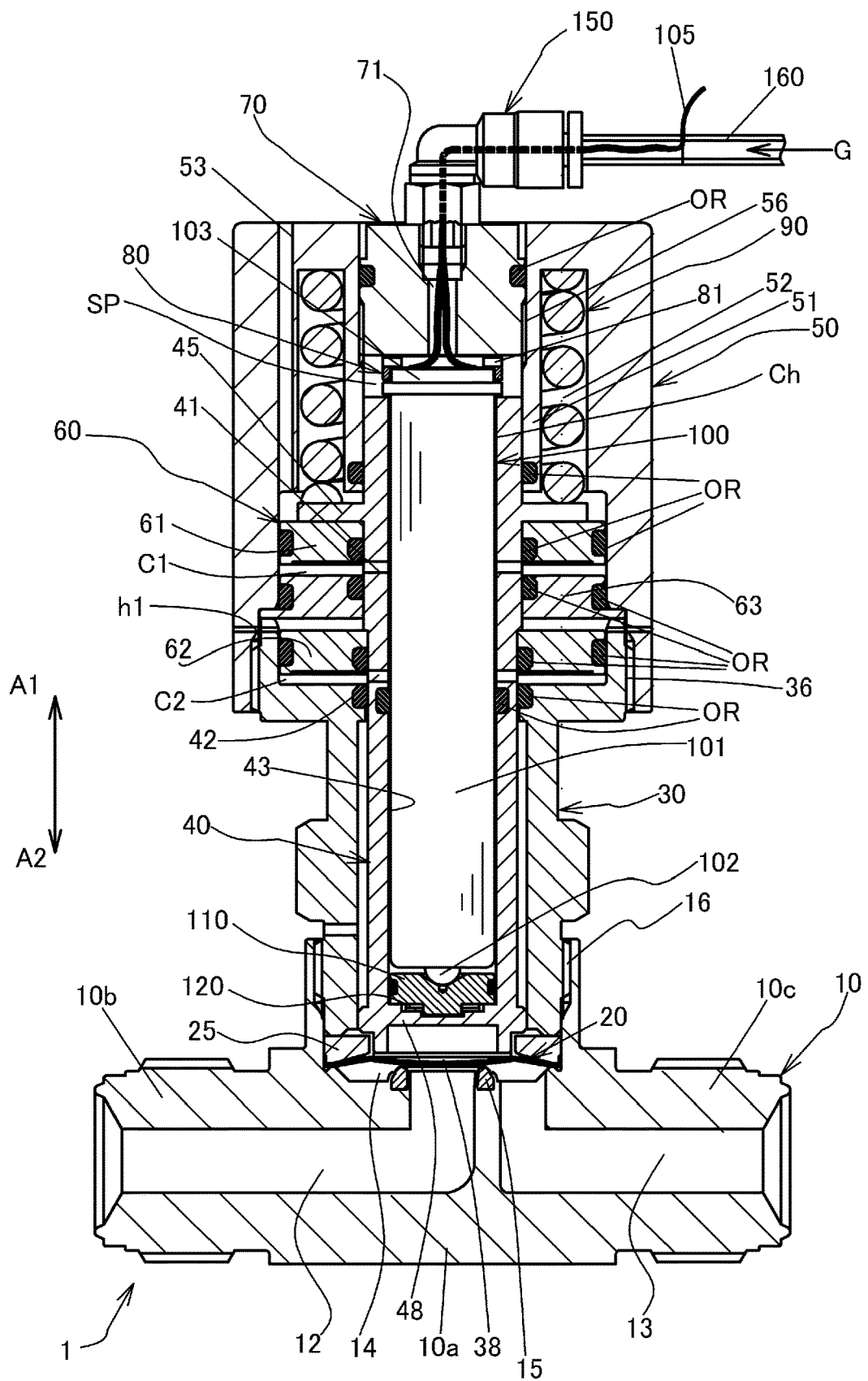

[fig.5]
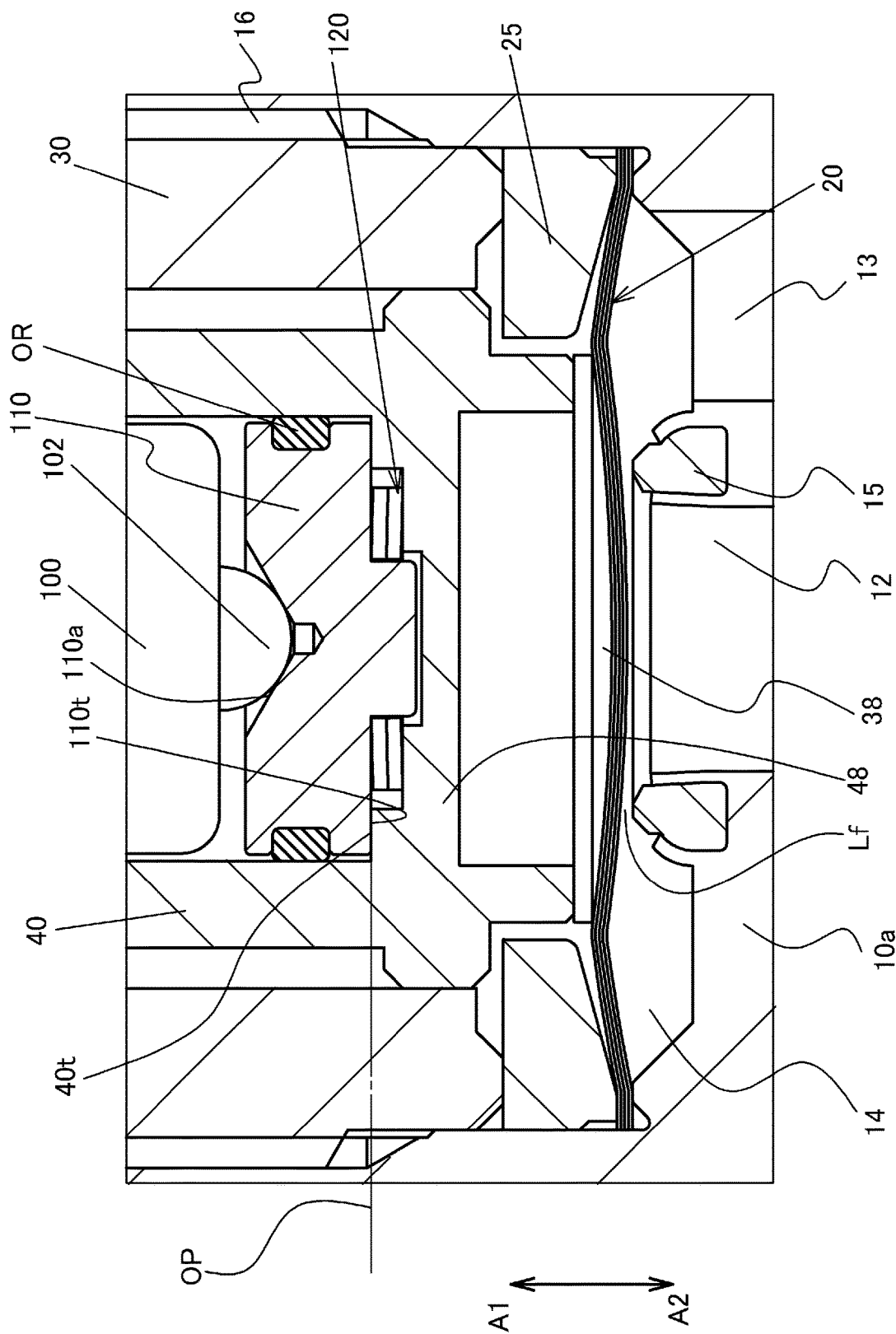

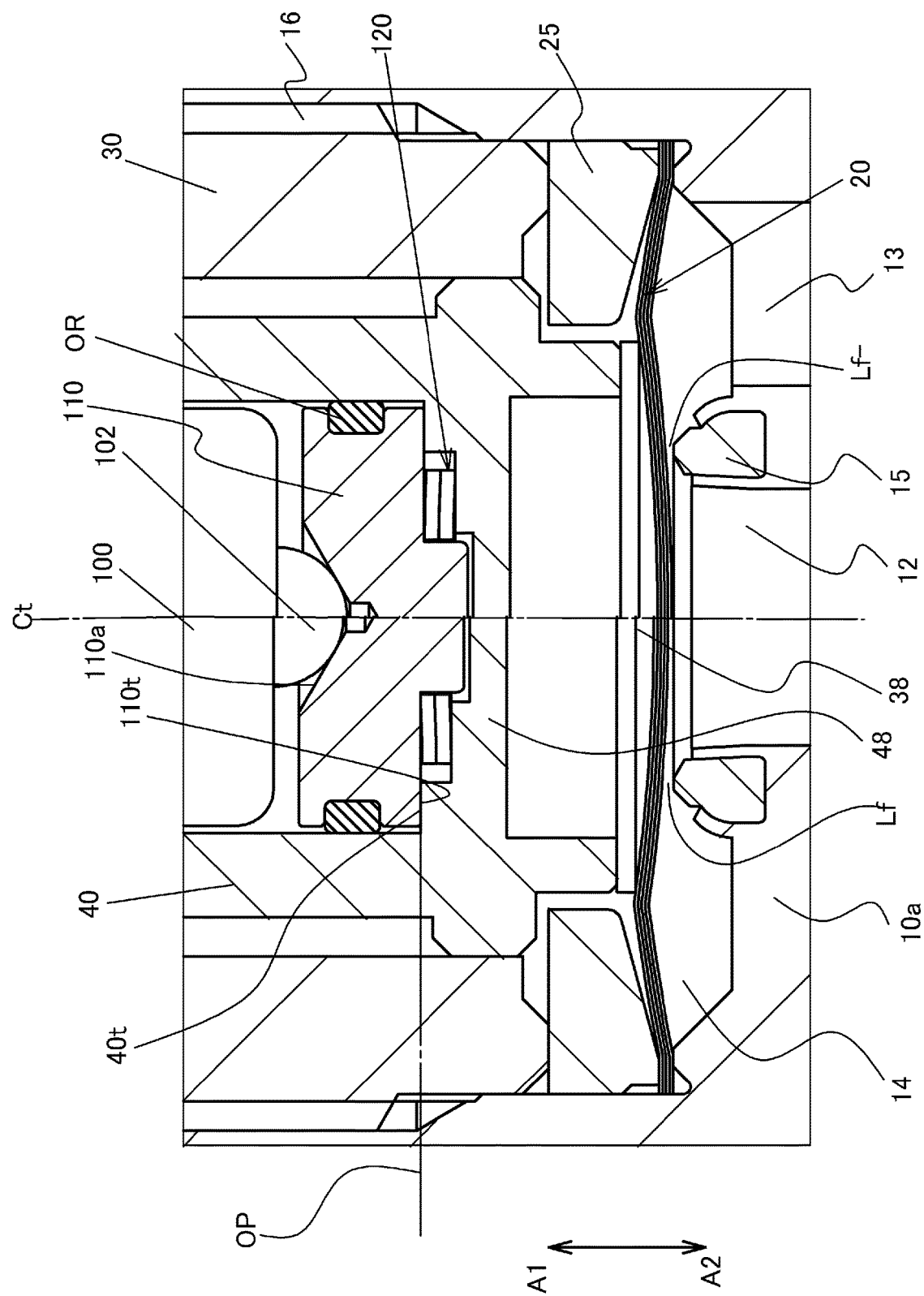

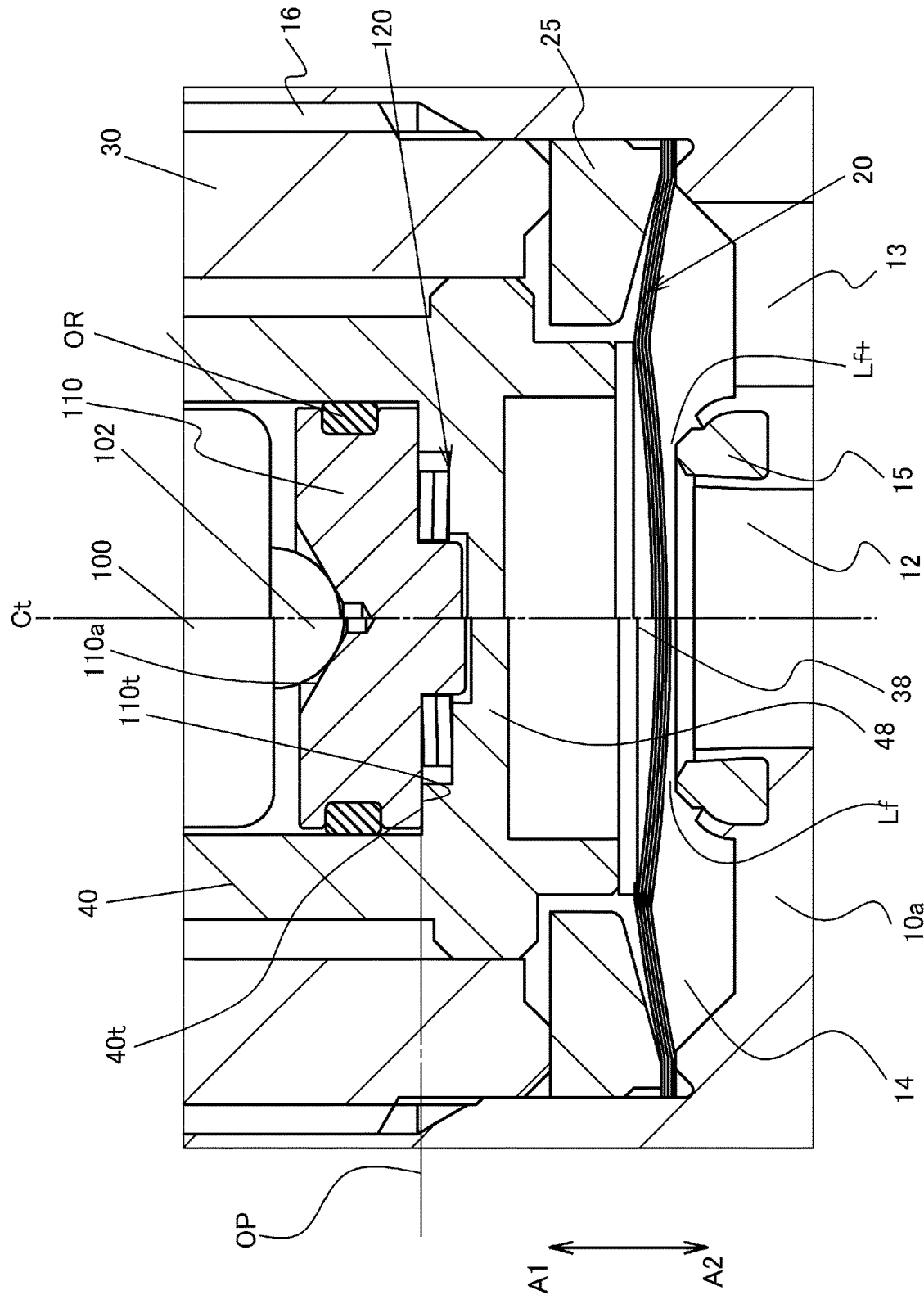
[fig.6B]

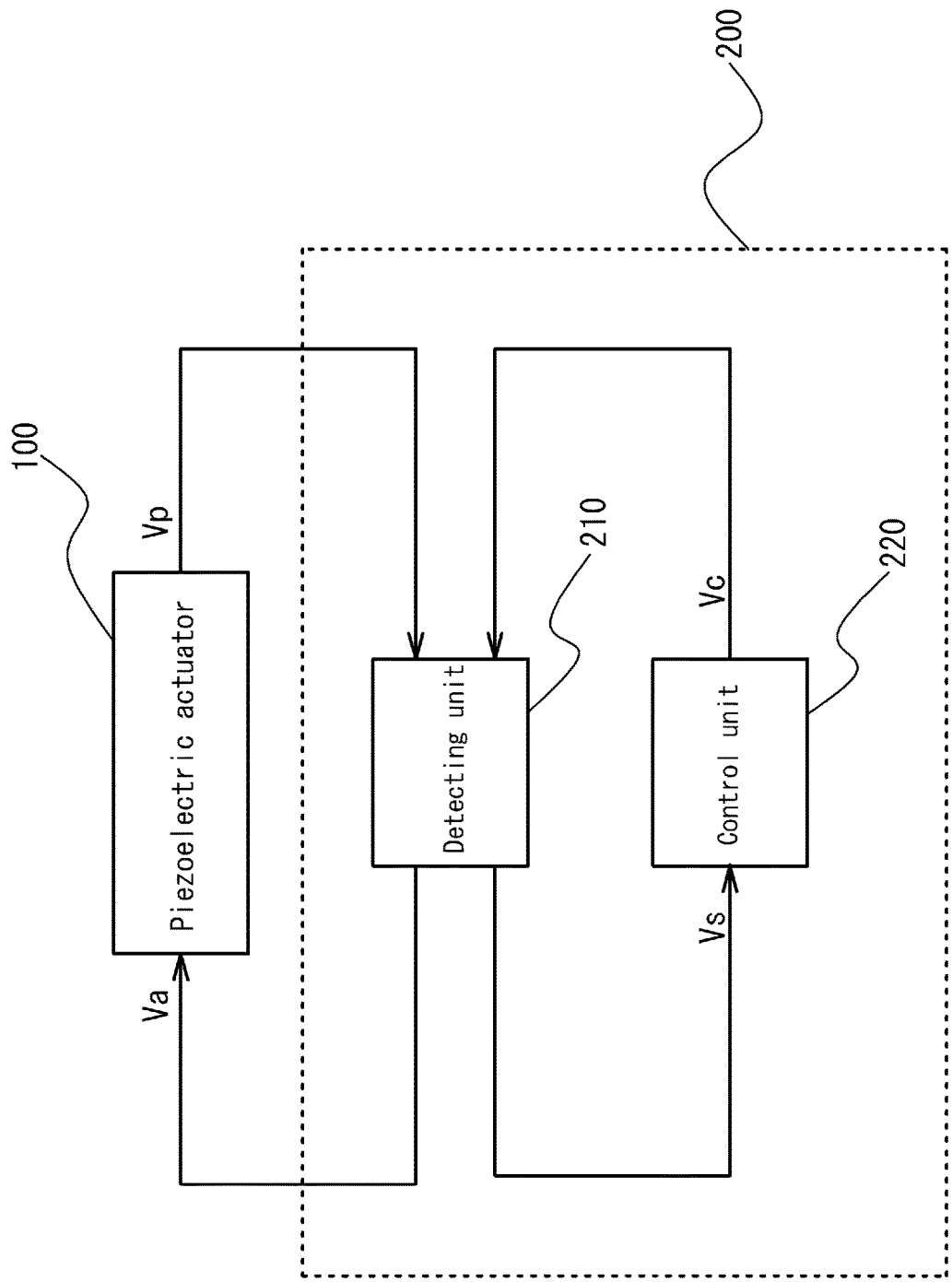

[fig.8]
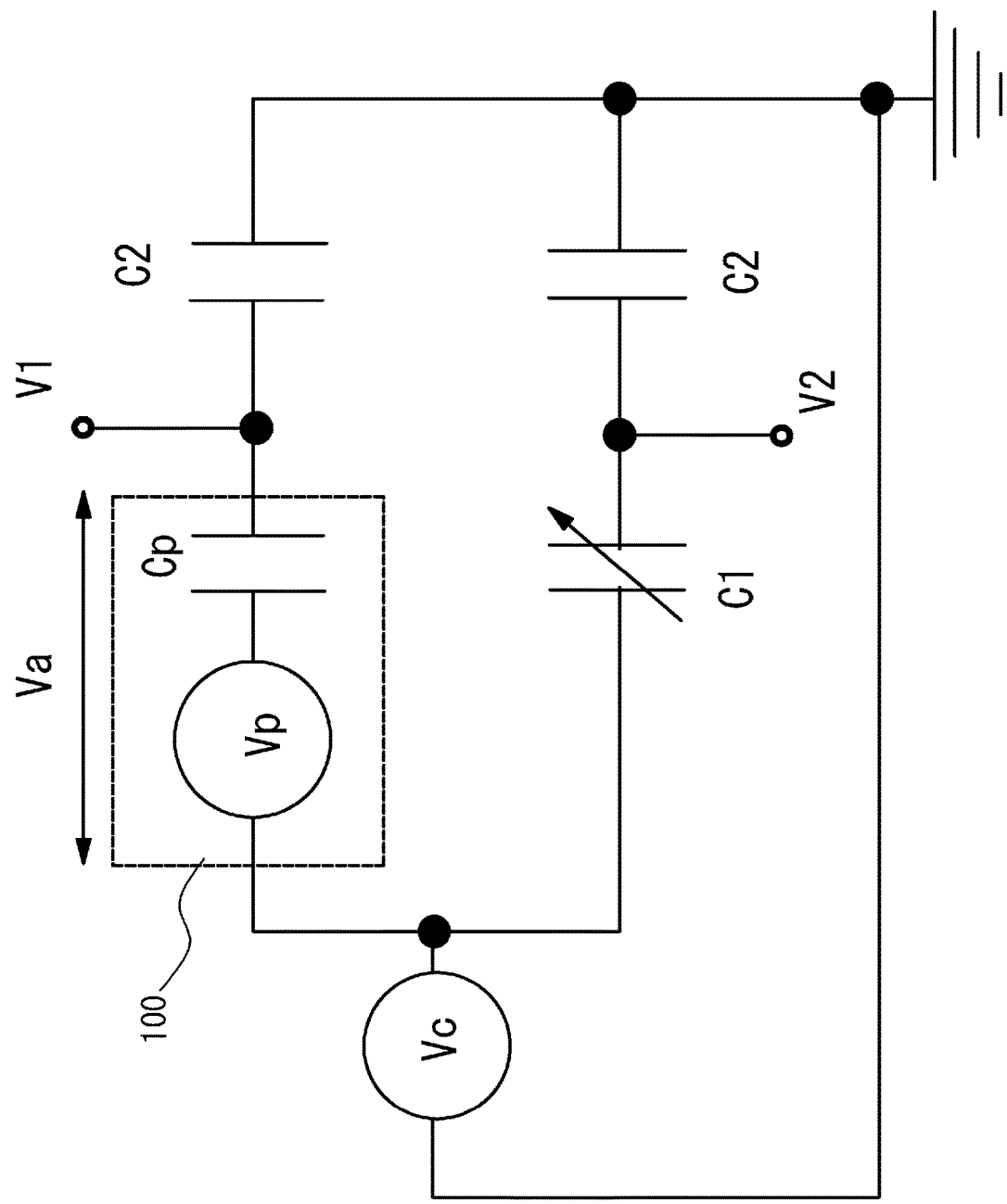

[fig.9]
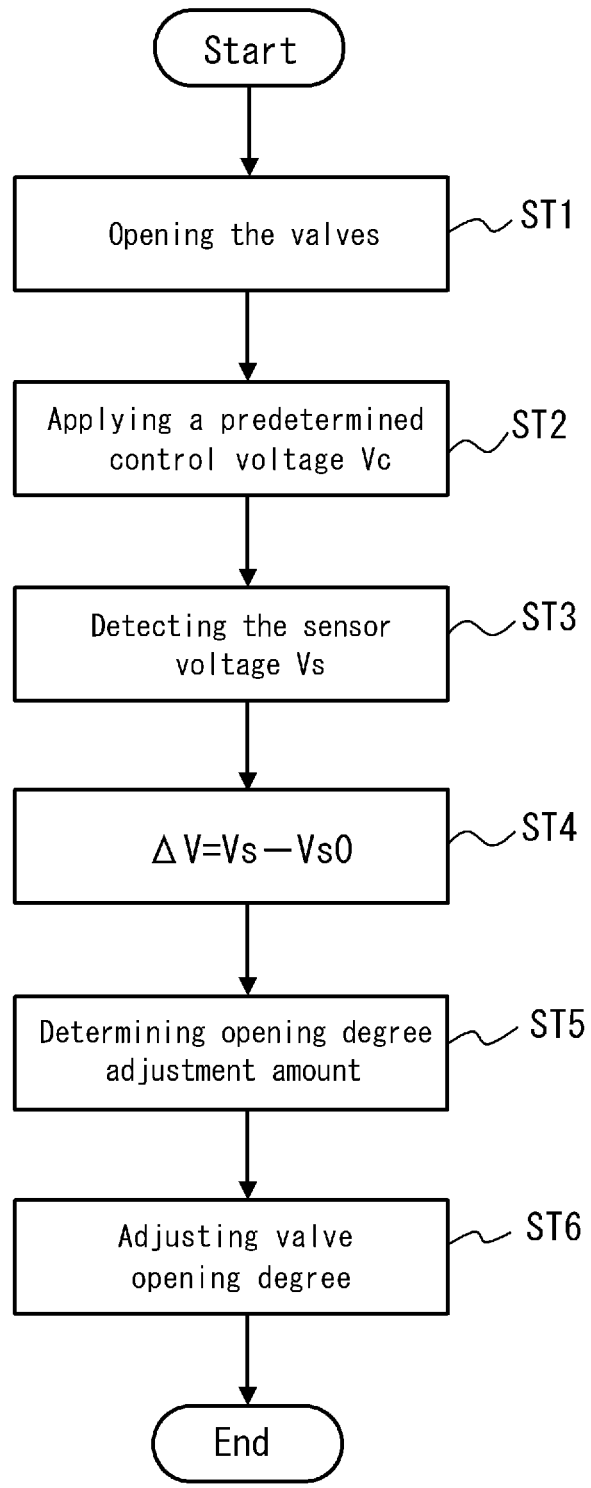

[fig.10]
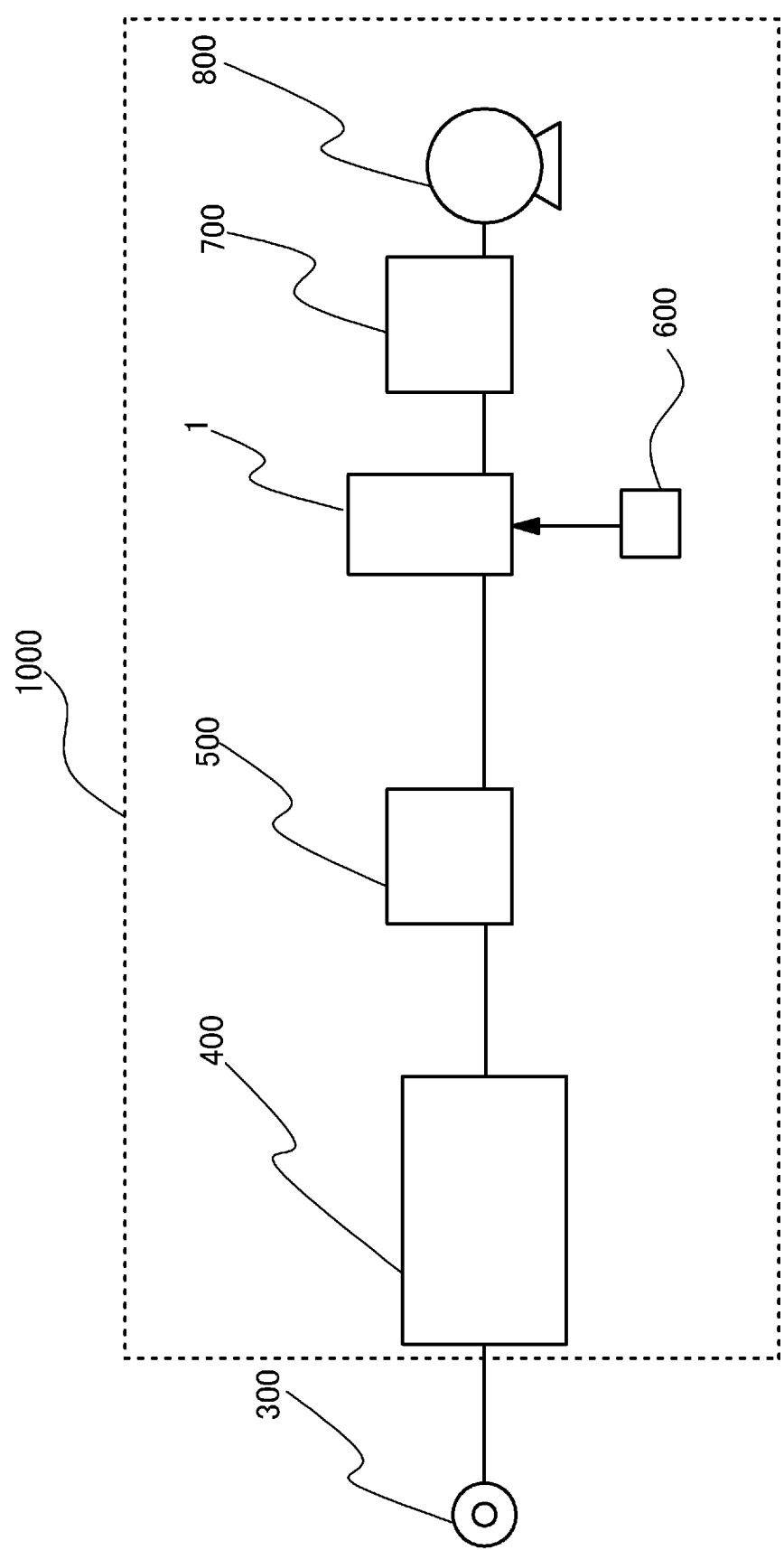

[fig.11]
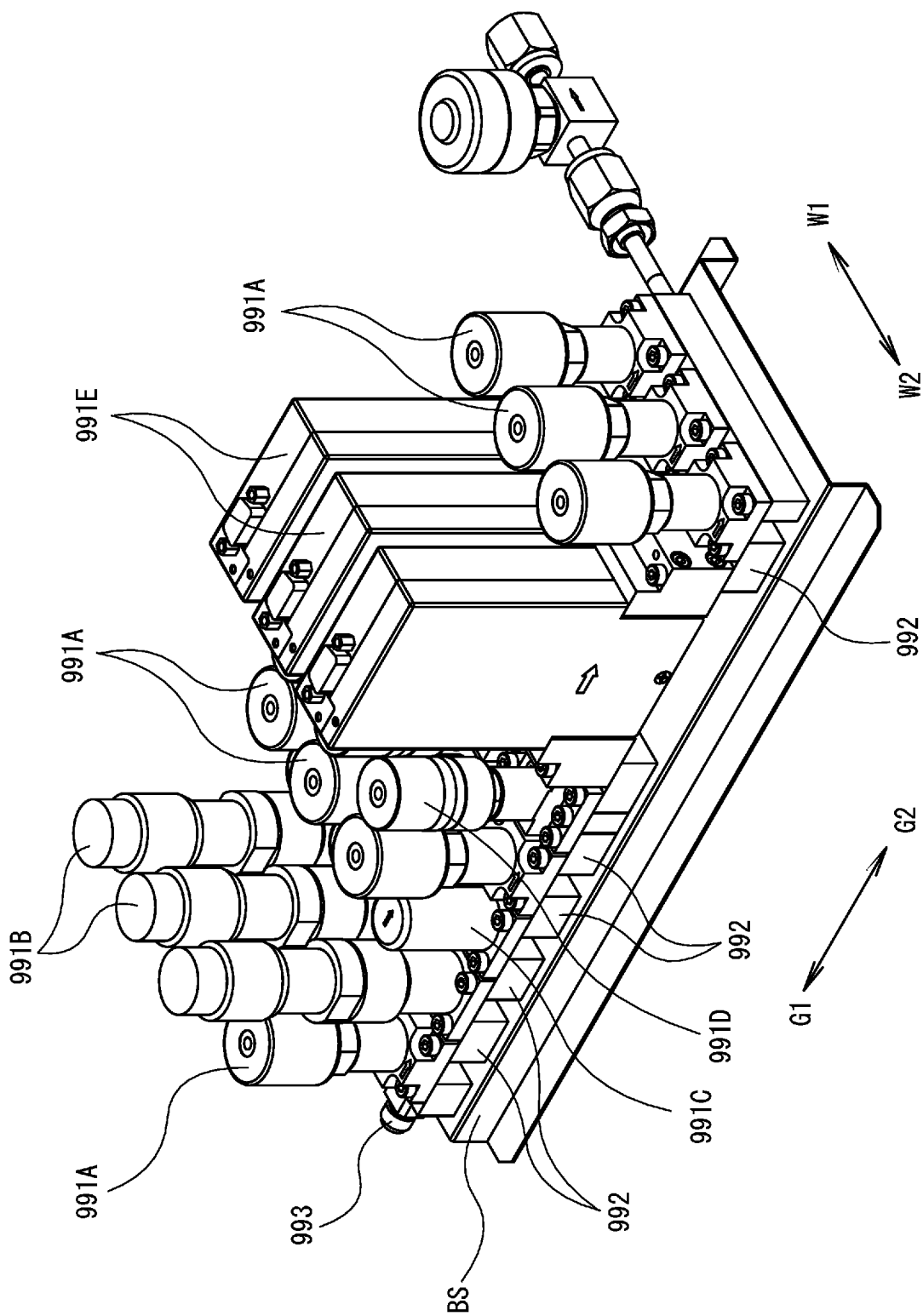

VALVE APPARATUS, FLOW RATE ADJUSTING METHOD, FLUID CONTROL APPARATUS, FLOW RATE CONTROL METHOD, SEMICONDUCTOR MANUFACTURING APPARATUS, AND SEMICONDUCTOR MANUFACTURING METHOD

TECHNICAL FIELD

The present invention relates to a valve device, a flow rate adjusting method of the valve device, a fluid control device including the valve, a semiconductor manufacturing apparatus, and a semiconductor manufacturing method.

BACKGROUND ART

In a semiconductor manufacturing process, a fluid control device called an integrated gas system in which various fluid devices such as an open-close valve, a regulator, and a mass flow controller are integrated is used in order to supply an accurately metered processing gas to a processing chamber. This integrated gas system housed in a box is called a gas box.

Usually, the processing gas outputted from the gas box is directly supplied to the processing chamber, but in a process of depositing a film on a substrate by an atomic layer deposition (ALD) method, in order to stably supply the processing gas, the processing gas supplied from the gas box is temporarily stored in a tank as a buffer, and a valve provided in the immediate vicinity of the processing chamber is frequently opened and closed to supply the processing gas from the tank to the processing chamber in a vacuum atmosphere. As a valve provided in the immediate vicinity of the processing chamber, see, for example, Patent Documents 1 and 2.

The ALD method is one of chemical vapor deposition methods, in which two or more types of processing gases are alternately flowed on the substrate surface under film forming conditions such as temperature and time to react with atoms on the substrate surface to deposit a film layer by layer, and since every monoatomic layer can be controlled, a uniform film thickness can be formed and a film can be grown very densely in terms of film quality.

In the semiconductor manufacturing process by the ALD method, it is necessary to precisely adjust the flow rate of the processing gas, and it is also necessary to secure a certain amount of flow rate of the processing gas by increasing the diameter of the substrate or the like.

PATENT LITERATURE

PTL 1: Japanese Laid-Open Patent Application No. 2007-64333
PTL 2: Japanese Laid-Open Patent Application No. 2016-121776

SUMMARY OF INVENTION

Technical Problem

However, in an air-driven valve, it is not easy to precisely adjust the flow rate by air pressure adjustment or mechanical adjustment. In addition, in the semiconductor manufacturing process by the ALD method, since the periphery of the processing chamber becomes high temperature, the valve is susceptible to temperature. Further, since the valve is opened and closed at high frequency, aging of the valve tends to occur, and a huge number of man-hours are required for the flow rate adjusting operation.

In addition, in order to detect a change in the valve opening degree due to aging by using the sensor, it is necessary to secure a space for installing the sensor, and there are also problems such as a difficulty in miniaturization of the device, a high cost of the device, and the like.

It is an object of the present invention to provide a valve device capable of precisely adjusting a flow rate variation due to aging or the like without using an external sensor.

Another object of the present invention is to provide a valve device capable of greatly reducing the flow rate adjusting step.

Still another object of the present invention is to provide a fluid control apparatus, a flow rate adjusting method, a semiconductor manufacturing method, and a semiconductor manufacturing apparatus using the above valve apparatus.

Solution to Problem

The valve device according to the present invention is a valve device including a valve body defining a flow path, a valve element provided so as to be capable of opening and closing the flow path of the valve body, and an operating member provided so as to be movable between a close position for making the valve element close the flow path and an open position for making the valve element open the flow path to operate the valve element.

The valve device has an adjusting actuator using a piezoelectric element for adjusting the position of the operating member positioned at the open position.

A driving circuit of the adjusting actuator includes a detecting unit for detecting an electric signal related to the amount of strain generated in the piezoelectric element, and a control unit for controlling the adjusting actuator so that the opening degree of the flow path by the valve body becomes a target opening degree based on an electric signal related to the strain amount of the piezoelectric element.

Preferably, the valve device of the present invention includes a main actuator for moving the operating member to one of the open position and the closed position, and a spring mechanism for moving the operating member to the other of the open position and the closed position.

The adjusting actuator may be configured to adjust the position of the operating member positioned in the open position by the main actuator or the spring mechanism.

A flow rate adjusting method of the valve device according to the present invention is a flow rate adjusting method of the valve device, which includes extracting an electric signal related to the amount of strain generated in the piezoelectric element in the driving circuit of the adjusting actuator, and controlling the adjusting actuator such that the opening degree of the flow path by the valve body becomes a target opening degree based on the detected electric signal related to the strain amount of the piezoelectric element.

Preferably, the flow rate adjusting method of the valve device of the present invention is the above flow rate adjusting method of the valve device, which includes driving the main actuator to open the flow path of the valve body, applying the control voltage preset for the adjustment operation to the piezoelectric element, extracting the electric signal related to the strain of the piezoelectric element to which the control voltage is applied, and determining the opening adjustment amount based on the electrical signal.

The method includes inputting a control signal corresponding to the determined opening adjustment amount to the adjusting actuator.

The fluid control device of the present invention is a fluid control device which comprises a plurality of fluid devices arranged from an upstream side to a downstream side, wherein the plurality of fluid devices includes the valve device.

The flow control method of the present invention uses the valve device described above to control the flow rate of the fluid.

The semiconductor manufacturing apparatus of the present invention uses the above-mentioned valve device for flow rate control of a process gas in a manufacturing process of a semiconductor device requiring a process step using a process gas in a sealed chamber.

In the semiconductor manufacturing method of the present invention, in a manufacturing process of a semiconductor device requiring a process step using a process gas in a sealed chamber, the above-mentioned valve device is used for controlling the flow rate of the process gas.

Advantageous Effects of Invention

According to the present invention, instead of using an external sensor, external force acting on the adjusting actuator can be estimated by detecting an electric signal relating to a strain generated when a predetermined control voltage is applied to the piezoelectric element of the adjusting actuator by a detection unit provided in a drive circuit of the adjusting actuator. By estimating the flow rate fluctuation amount due to aging of the valve device from the change of the external force, and compensating the fluctuation amount with the adjusting actuator, it becomes possible to perform precise flow rate management.

According to the present invention, since the process gas supplied to the processing chamber can be controlled more precisely, a high-quality film can be stably formed on the substrate.

BRIEF DESCRIPTION OF DRAWINGS

FIG. 1 is a longitudinal cross-sectional view of a valve device according to an embodiment of the present invention.

FIG. 2 is an enlarged cross-sectional view of a main part of the valve device of FIG. 1 in a closed state.

FIG. 3 is an explanatory view showing the operation of the piezoelectric actuator.

FIG. 4 is a longitudinal cross-sectional view of the valve assembly of FIG. 1 in an open condition.

FIG. 5 is an enlarged cross-sectional view of a main part of the valve device of FIG. 4.

FIG. 6A is an enlarged cross-sectional view of a main part of the valve device of FIG. 4 for explaining a flow rate adjusting state (flow rate decreasing state).

FIG. 6B is an enlarged cross-sectional view of a main part of the valve device of FIG. 4 for explaining a flow rate adjusting state (flow rate increasing state).

FIG. 7 is a functional block diagram showing a schematic configuration of a driving circuit of the present invention.

FIG. 8 is a diagram showing a specific circuit example of the detection unit of FIG. 7.

FIG. 9 is a flow chart showing an example of the flow rate adjusting process.

FIG. 10 is a schematic diagram showing an application example of the valve device according to the embodiment of the present invention to a semiconductor manufacturing process.

FIG. 11 is a perspective view showing an example of a fluid control device using the valve device of the present embodiment.

DESCRIPTION OF EMBODIMENTS

Embodiments of the present invention will be described below with reference to the drawings. In the present specification and the drawings, the same reference numerals are used to denote components having substantially the same functions, and thus a repetitive description thereof is omitted.

FIG. 1 is a view showing a configuration of a valve device according to an embodiment of the present invention, showing a state in which a valve is fully closed, FIG. 2 is an enlarged cross-sectional view of a main part of FIG. 1, and FIG. 3 is a view for explaining an operation of a piezoelectric actuator as an adjusting actuator. In the following description, it is assumed that the upward direction is the opening direction A1 and the downward direction is the closing direction A2.

In FIG. 1, 1 denotes a valve device, 10 denotes a valve body, 20 denotes a diaphragm as a valve element, 38 denotes a diaphragm presser, 30 denotes a bonnet, 40 denotes an operating member, 50 denotes a casing, 60 denotes a main actuator, 70 denotes an adjusting body, 80 denotes an actuator holder, 90 denotes a coil spring, 100 denotes a piezoelectric actuator as an adjusting actuator, 110 denotes an actuator receiver, 120 denotes a disk spring as an elastic member, and OR denotes an O-ring as a seal member.

The valve body 10 is made of stainless steel and has a block-shaped valve body main portion 10a and connecting portions 10b and 10c protruding from the sides of the valve body main portion 10a, respectively, and defines flow paths 12 and 13. One end of each of the flow paths 12 and 13 opens at an end surface of each of the connecting portions 10b and 10c, and the other end communicates with a concave valve chamber 14 opened upward. A valve seat 15 made of a synthetic resin (PFA, PA, PI, PCTFE, or the like) is fitted and fixed to a mounting groove provided in an opening peripheral edge of the other end side of the flow path 12 on the bottom surface of the valve chamber 14. In the present embodiment, as is clear from FIG. 2, the valve seat 15 is fixed in the mounting groove by crimping.

The diaphragm 20 is a valve element provided so as to be able to open and close the flow paths 12 and 13 of the valve body 10, is disposed above the valve seat 15, maintains the airtightness of the valve chamber 14, and opens and closes the flow paths 12 and 13 when the central portion thereof moves up and down to be seated on and off the valve seat 15. In the present embodiment, the diaphragm 20 has a spherical shell shape in which an upward convex arc shape in natural state formed by swelling upward a central portion of a metal thin plate of special stainless steel or the like and a nickel-cobalt alloy thin plate. Three such special stainless steel sheets and one nickel-cobalt alloy sheet are laminated to form a diaphragm 20.

The diaphragm 20 is mounted on a protruding portion of the inner peripheral surface of the valve chamber 14 at its peripheral edge portion, and is pressed toward the protruding portion side of the valve body 10 through a pressing adapter 25 made of stainless alloy by inserting the lower end portion of the bonnet 30 into the valve chamber 14 and screwing the lower end portion with the screw portion 16 of the valve body 10, and is clamped and fixed in an airtight state. The nickel-cobalt alloy thin film is disposed on the gas contact side.

It should be noted that diaphragms having other configurations can also be used.

The operating member 40 is a member for operating the diaphragm 20 so as to open and close the flow paths 12 and 13 to the diaphragm 20, and is formed in a substantially cylindrical shape, closed at its lower end by the closing part 48, opened at its upper end, fitted to the inner peripheral surface of the bonnet 30 and the inner peripheral surface of the cylindrical portion 51 formed in the casing 50, and supported movably in the vertical direction. Note that A1 and A2 shown in FIGS. 1 and 2 indicate the opening and closing directions of the operating member 40, A1 indicates the opening direction, and A2 indicates the closing direction. In the present embodiment, the upward direction is the opening direction A1 and the downward direction is the closing direction A2 with respect to the valve body 10, but the present invention is not limited thereto.

A diaphragm presser 38 made of a synthetic resin such as polyimide and abutting on the upper surface of the central portion of the diaphragm 20 is mounted on the lower end surface of the operating member 40.

A coil spring 90 is provided between the upper surface of the flange portion 45 formed on the outer peripheral surface of the operating member 40 and the ceiling surface of the casing, and the operating member 40 is constantly biased in the closing direction A2 by the coil spring 90. Therefore, as shown in FIG. 2, in a state in which the main actuator 60 is not operated, the diaphragm 20 is pressed against the valve seat 15, and the gateway between the flow paths 12 and 13 is closed.

The flange portion 45 may be integral with or separate from the operating member 40.

The coil spring 90 is accommodated in a holding portion 52 formed between the inner peripheral surface of the casing 50 and the cylindrical portion 51. In the present embodiment, the coil spring 90 is used, but the present invention is not limited thereto, and other types of springs such as a disk spring and a leaf spring can be used.

The casing 50 is fixed to the bonnet 30 by screwing the inner periphery of the lower end portion thereof into a screw portion 36 formed on the outer periphery of the upper end portion of the bonnet 30. An annular bulkhead 63 is fixed between the upper end surface of the bonnet 30 and the casing 50.

Cylinder chambers C1 and C2 vertically partitioned by a bulkhead 63 are formed between the outer peripheral surface of the operating member 40 and the casing 50 and the bonnet 30.

A piston 61 formed in an annular shape is fitted and inserted into the upper cylinder chamber C1, and a piston 62 formed in an annular shape is fitted and inserted into the lower cylinder chamber C2. The cylinder chambers C1 and C2 and the pistons 61 and 62 constitute a main actuator 60 for moving the operating member 40 in the opening direction A1. The main actuator 60 is configured so that the force by the operating gas can be increased by increasing the working area of the pressure using the two pistons 61 and 62.

The space above the piston 61 of the cylinder chamber C1 is connected to the atmosphere by the air passage 53. The space above the piston 62 of the cylinder chamber C2 is connected to the atmosphere by the air passage h1.

Since high-pressure operating gas is supplied to the space below the pistons 61 and 62 of the cylinder chambers C1 and C2, the O-ring OR maintains airtightness. These spaces communicate with the flow passages 41 and 42 formed in the operating member 40, respectively. The flow passages 41 and 42 communicate with a flow passage Ch formed between the inner peripheral surface of the operating member 40 and the outer peripheral surface of the case body 101 of the piezoelectric actuator 100, and the flow passage Ch communicates with a space SP formed by the upper end surface of the operating member 40, the cylindrical portion 51 of the casing 50, and the lower end surface of the adjustment body 70. The flow passage 81 formed in the annular actuator presser 80 connects the space SP and the flow passage 71 passing through the center of the adjustment body 70. The flow passage 71 of the adjustment body 70 communicates with the pipe 160 via the pipe fitting 150.

The piezoelectric actuator 100 incorporates a laminated piezoelectric element (not shown) in a cylindrical case body 101 shown in FIG. 3. The case body 101 is made of a metal such as a stainless steel alloy, and the end surface on the side of the hemispherical fore-end portion 102 and the end surface on the side of the base end portion 103 are closed. By applying a voltage to the laminated piezoelectric element and extending it, the end surface of the case body 101 on the side of the fore-end portion 102 is elastically deformed, and the hemispherical fore-end portion 102 is displaced in the longitudinal direction. Assuming that the largest stroke of the stacked piezoelectric elements is 2d, the total length of the piezoelectric actuator 100 becomes L0 by previously applying a predetermined voltage V0 at which the elongation of the piezoelectric actuator 100 becomes d. When a voltage higher than the predetermined voltage V0 is applied, the total length of the piezoelectric actuator 100 becomes L0+d at the maximum, and when a voltage (including no voltage) lower than the predetermined voltage V0 is applied, the total length of the piezoelectric actuator 100 becomes L0−d at the minimum. Therefore, it is possible to expand and contract the entire length from the fore-end portion 102 to the base end portion 103 in the opening and closing directions A1 and A2. In the present embodiment, the fore-end portion 102 of the piezoelectric actuator 100 is hemispherical, but the present invention is not limited thereto, and the fore-end portion may be a flat surface.

As shown in FIG. 1, power is supplied to the piezoelectric actuator 100 by a wiring 105. The wiring 105 is led through the flow passage 71 of the adjustment body 70 and the pipe fitting 150 to the pipe 160, and is led out to the outside from the middle of the pipe 160.

The position of the base end portion 103 of the piezoelectric actuator 100 in the opening/closing direction is defined by the lower end surface of the adjustment body 70 via the actuator presser 80. In the adjustment body 70, a screw portion provided on the outer peripheral surface of the adjustment body 70 is screwed into the screw hole 56 formed in the upper portion of the casing 50, and the positions of the opening and closing directions A1 and A2 of the piezoelectric actuator 100 can be adjusted by adjusting the positions of the opening and closing directions A1 and A2 of the adjustment body 70.

As shown in FIG. 2, the fore-end portion 102 of the piezoelectric actuator 100 abuts against a conical receiving surface 110a formed on the upper surface of the disk-shaped actuator receiver 110. The actuator receiver 110 is movable in the opening and closing directions A1 and A2.

Between the lower surface of the actuator receiver 110 and the upper surface of the closing part 48 of the operating member 40, a disk spring 120 as an elastic member is provided. In the state shown in FIG. 2, the disk spring 120 is already compressed to some extent and elastically deformed, and the actuator receiver 110 is constantly urged in the opening direction A1 by the restoring force of the disk spring 120. As a result, the piezoelectric actuator 100 is also constantly urged in the opening direction A1, and the upper surface of the base end portion 103 is pressed against the actuator presser 80. Thus, the piezoelectric actuator 100 is disposed at a predetermined position with respect to the valve body 10. Since the piezoelectric actuator 100 is not connected to any member, it is relatively movable in the opening and closing direction A1, A2 with respect to the operating member 40.

The number and orientation of the disk springs 120 can be appropriately changed according to conditions. In addition, other elastic members such as a coil spring and a leaf spring can be used in addition to the disk spring 120, but the use of the disk spring has an advantage that the spring rigidity, the stroke, and the like can be easily adjusted.

As shown in FIG. 2, in a state in which the diaphragm 20 abuts against the valve seat 15 and the valve is closed, a gap is formed between the regulating surface 110t on the lower surface side of the actuator receiver 110 and the abutting surface 40t on the upper surface side of the closing part 48 of the operating member 40. The distance of this gap corresponds to the lift amount Lf of the diaphragm 20. The lift amount Lf defines the opening degree of the valve, that is, the flow rate. The lift amount Lf can be changed by adjusting the positions in the opening and closing directions A1 and A2 of the adjustment body 70. The operating member 40 in the state shown in FIG. 2 is positioned at the closed position CP with reference to the abutting surface 40t. When the abutting surface 40t moves to a position where it abuts the regulating surface 110t of the actuator receiver 110, that is, to the open position OP, the diaphragm 20 is separated from the valve seat 15 by the lift amount Lf.

Next, the operation of the valve device 1 having the above-described configuration will be described by referring to FIGS. 4 to 6B.

As shown in FIG. 4, when the operation gas G having a predetermined pressure is supplied into the valve device 1 through the pipe 160, a thrust force for pushing the piston 61, 62 upward in the opening direction A1 acts on the operating member 40. The pressure of the operating gas G is set to a value sufficient to move the operating member 40 in the opening direction A1 against the urging force in the closing direction A2 acting on the operating member 40 from the coil spring 90 and the disk spring 120. When such an operating gas G is supplied, as shown in FIG. 5, the operating member 40 moves in the opening direction A1 while further compressing the disk spring 120, the abutting surface 40t of the operating member 40 abuts on the regulating surface 110t of the actuator receiver 110, and the actuator receiver 110 receives a force from the operating member 40 toward the opening direction A1. This force acts as a force that compresses the piezoelectric actuator 100 in the opening and closing directions A1, A2 through the fore-end portion 102 of the piezoelectric actuator 100, but the piezoelectric actuator 100 has sufficient rigidity to resist this force. Therefore, the force in the opening direction A1 acting on the operating member 40 is received by the fore-end portion 102 of the piezoelectric actuator 100, and the movement of the operating member 40 in the A1 direction is restricted in the open position OP. In this state, the diaphragm 20 is separated from the valve seat 15 by the lift amount Lf described above.

When it is desired to adjust the flow rate of the fluid output and supplied through the flow path 13 of the valve device 1 in the state shown in FIG. 5, the piezoelectric actuator 100 is operated.

The left side of the center line Ct in FIGS. 6A and 6B shows a state shown in FIG. 5, and the right side of the center line Ct shows a state after the positions of the opening and closing directions A1 and A2 of the operating member 40 are adjusted.

When the flow rate of the fluid is adjusted in the decreasing direction, as shown in the drawing 6A, the piezoelectric actuator 100 is extended to move the operating member 40 in the closing direction A2. As a result, the lift amount Lf− after adjustment, which is the distance between the diaphragm 20 and the valve seat 15, becomes smaller than the lift amount Lf before adjustment.

When the flow rate of the fluid is adjusted in the increasing direction, the piezoelectric actuator 100 is shortened to move the operating member 40 in the opening direction A1 as shown in the drawing 6B. As a result, the lift amount Lf+ after adjustment, which is the distance between the diaphragm 20 and the valve seat 15, becomes larger than the lift amount Lf before adjustment.

In the present embodiment, the maximum value of the lift amount of the diaphragm 20 is about 100 to 200 μm, and the adjustment amount by the piezoelectric actuator 100 is about ±20 μm.

That is, the stroke of the piezoelectric actuator 100 cannot cover the lift amount of the diaphragm 20, but by using the main actuator 60 operated by the operation gas G and the piezoelectric actuator 100 in combination, the flow rate can be precisely adjusted by the piezoelectric actuator 100 having a relatively short stroke while securing the flow rate supplied by the valve device 1 by the main actuator 60 having a relatively long stroke, and the flow rate need not be manually adjusted by the adjustment body 70 or the like, so that the number of steps for flow rate adjustment is greatly reduced.

According to the present embodiment, precise flow rate adjustment is possible only by changing the voltage applied to the piezoelectric actuator 100, so that flow rate adjustment can be immediately performed, and flow rate control can also be performed in real time.

Automatic Flow Adjustment

In the above embodiment, when adjusting the flow rate, it is assumed that the flow rate adjustment amount (lift amount) is known in advance.

However, the mechanical characteristics of the components such as the diaphragm 20, the disk spring 120, and the coil spring 90, which constitute the valve device 1, change in accordance with the opening/closing frequency and the operating period of the valve device 1. For example, when the restoring force at the initial stage of the diaphragm 20 is compared with the restoring force after the diaphragm 20 has been used for a long period of time, the restoring force at the initial stage is larger. Therefore, when the opening and closing operation of the valve device 1 is repeated for a long period of time, the flow rate deviates from the preset flow rate due to the gradual change in the mechanical characteristics of the components described above.

However, in a valve device which has been miniaturized and integrated, it is impractical to provide an external sensor or the like for monitoring the fluctuation of the flow rate, and the cost of such device becomes high.

Here, an example of automation of flow rate adjustment will be described with reference to FIGS. 7 to 9 using the piezoelectric actuator 100 as a sensor instead of providing an external sensor or the like for monitoring and detecting a flow rate variation.

As shown in FIG. 7, the drive circuit 200 for driving the piezoelectric actuator 100 includes a detecting unit 210 and a control unit 220.

Here, the electrical equivalent model of the piezoelectric actuator 100 can be approximated to a series connection of a voltage source (also called a voltage signal) Vp caused by strain and a capacitor Cpn, as shown by a broken line in FIG. 8, in a low-frequency region less than the electrical resonance frequency.

Since the voltage source Vp is proportional to the strain of the piezoelectric element, the strain due to the external force of the piezoelectric element can be detected by measuring both terminal voltages of the piezoelectric element. That is, the piezoelectric actuator 100 can also be used as a sensor for detecting an external force.

The amount of strain of the piezoelectric element of the piezoelectric actuator 100 is the sum of the component caused by the deformation of the piezoelectric element by the external force and the component caused by the deformation of the piezoelectric element by the applied voltage Va.

It is impossible to extract the voltage source Vp caused by the strain in a state where the applied voltage Va is applied to the piezoelectric element of the piezoelectric actuator 100. Therefore, as shown in FIG. 8, a bridge circuit is formed to extract self-detecting strain of the piezoelectric element. In these bridging circuits, the control voltage Vc is not directly applied to the piezoelectric elements, and Va=Vc−V1. In the bridge circuit of FIG. 8, C1 is a reference capacitor and C2 is a gain capacitor.

If the sensor voltage Vs is defined as V1−V2 and adjusted so that C1=Cp, the following equation is satisfied.

$$Vs = Vp \times Cp/(Cp+C2) = K \times Vp \qquad (1)$$

In this manner, the influence of the control voltage Vc is removed, and the sensor voltage Vs can be extracted in the form of a divided voltage in which the gain K is applied only to the voltage signal Vp related to the strain of the piezoelectric element.

As shown in FIG. 9, the flow rate is adjusted by driving the main actuator 60 to open the valves (step ST1). In this state, an external force such as a restoring force of the coil spring 90 acts on the piezoelectric actuator 100, and the piezoelectric element is deformed. In step ST2, a predetermined control voltage Vc is applied. As a result, the strain amount of the piezoelectric element of the piezoelectric actuator 100 is in a state including a component caused by the deformation of the piezoelectric element by the external force and a component caused by the deformation of the piezoelectric element by the applied voltage Va.

In step ST3, the sensor voltage Vs is detected.

Assuming that the sensor voltage in the initial setting of the valve device 1 is Vs0, the detected sensor voltage Vs differs from the initial sensor voltage Vs0 if the mechanical characteristics of the valve device 1 (i.e., the mechanical characteristics of the coil spring 90 and the diaphragm 20) change over time, age, or the like. The deviation ΔV between the detected sensor voltage Vs and the initial sensor voltage Vs0 is calculated (step ST4) and the deviation ΔV is expected to be proportional to the magnitude of the change in the mechanical characteristics of the valve device 1. Since the change in the mechanical characteristics of the valve device 1 is the main cause of the flow rate change, the flow rate adjustment amount (opening degree adjustment amount) is determined in accordance with the magnitude of the deviation ΔV (step ST5). In step ST6, the control voltage Vc' corresponding to the determined opening degree adjustment amount is determined and supplied to the piezoelectric actuator 100.

Note that the flow rate adjustment procedure described above is an example, and various other methods can be employed. Although the case where only the voltage signal Vp related to the strain amount of the piezoelectric element is extracted by the bridge circuit shown in FIG. 8 is exemplified, other methods can be employed as long as the voltage signal Vp related to the strain amount of the piezoelectric element can be extracted without using an external sensor.

Next, an application example of the valve device 1 described above will be described with reference to FIG. 10.

The system shown in FIG. 10 is a semiconductor manufacturing apparatus 1000 for executing a semiconductor manufacturing process by the ALD method, in which 300 denotes a process gas supply source, 400 denotes a gas box, 500 denotes a tank, 600 denotes a controller, 700 denotes a processing chamber, and 800 denotes an exhaust pump.

In the semiconductor manufacturing process by the ALD method, it is necessary to precisely adjust the flow rate of the processing gas, and it is also necessary to secure a certain amount of flow rate of the processing gas by increasing the diameter of the substrate.

The gas box 400 is a fluid control device in which various fluid devices such as an open-close valve, a regulator, and a mass flow controller are integrated and accommodated in the box in order to supply accurately metered process gas to the processing chamber 700.

The tank 500 functions as a buffer for temporarily storing the processing gas supplied from the gas box 400.

The controller 600 gives commands for controlling the supply of the operating gas G to the valve device 1 and for controlling the flow rate by the piezoelectric actuator 100.

The processing chamber 700 provides a sealed processing space for forming a film on a substrate by an ALD method.

The exhaust pump 800 draws a vacuum in the processing chamber 700.

According to the system configuration as described above, the initial adjustment of the processing gas becomes possible by sending a command for flow rate adjustment from the controller 600 to the valve device 1.

In addition, the flow rate of the processing gas can be adjusted even during the film formation process in the processing chamber 700, and the flow rate of the processing gas can be optimized in real time.

In the above application example, the case where the valve device 1 is used in the semiconductor manufacturing process by the ALD method has been exemplified, but the present invention is not limited to this, and can be applied to any object requiring precise flow rate adjustment.

In the above embodiment, a piston incorporated in a cylinder chamber operated by gas pressure is used as the main actuator, but the present invention is not limited to this, and an optimum actuator can be variously selected according to a control target.

In the above embodiment, a so-called normally closed type valve is exemplified, but the present invention is not limited to this, and is also applicable to a normally open type valve. In this case, for example, the opening degree of the valve body may be adjusted by the adjusting actuator.

Although the diaphragm is exemplified as the valve element in the above embodiment, the present invention is not limited to this, and other types of valve elements may be employed.

In the above embodiment, the case of extracting the voltage signal related to the strain of the piezoelectric element has been exemplified, but the present invention is not limited to this, and a circuit for extracting the current signal related to the strain of the piezoelectric element can also be employed.

An example of a fluid control device to which the valve device of the present invention is applied will be described with reference to FIG. 11.

The fluid control device shown in FIG. 11 is provided with a base plate BS made of metal, which is arranged along the width directions W1 and W2 and extends in the longitudinal directions G1 and G2. Note that W1 represents the front side, W2 represents the back side, G1 represents the upstream side, and G2 represents the downstream side. Various fluid devices 991A to 991E are installed on the base plate BS via a plurality of flow path blocks 992, and a flow path (not shown) through which a fluid flows from the upstream side G1 toward the downstream side G2 is formed by the plurality of flow path blocks 992.

Here, a "fluid device" is a device used in a fluid control device for controlling a flow of a fluid, and includes a body defining a fluid flow path, and has at least two flow path ports opening at a surface of the body. Specific examples include, but are not limited to, an open-close valve (two-way valve) 991A, a regulator 991B, a pressure gauge 991C, an open-close valve (three-way valve) 991D, a mass flow controller 991E, and the like. The introducing pipe 993 is connected to a flow passage port on the upstream side of the flow passage (not shown) described above.

The present invention can be applied to various valve devices such as the above-described open-close valves 991A and 991D and the regulator 991B.

REFERENCE SIGNS LIST

1: Valve device
10: Valve body
10a: Valve body main portion
10b: Connecting portion
10c: Connecting portion
12: Flow path
13: Flow path
14: Valve chamber
15: Valve seat
16: Screw portion
20 Diaphragm
25: Pressing adapter
30: bonnet
36: Screw portion
38: Diaphragm presser
40: Operating member
40t: abutting surface
41: Flow passage
42: Flow passage
45: Flange portion
48: Closing part
50: Casing
51: Cylindrical part
52: Holding part
53: Air passage
56: Screw hole
60: Main actuator
61: Piston
62: Piston
63: Bulkhead
70: Adjustment body
71: Flow passage
80: Actuator presser
81: Flow passage
90: Coil spring
100: Piezoelectric actuator
101: Case body
102: Fore-end portion
103: Base end
105: Wiring
110: Actuator receiver
110a: Receiving surface
110t: Regulating surface
120: Disk spring
150: Pipe fitting
160: Tube
200: Drive circuit
210: Detecting unit
220: Control unit
300: Process gas source
400: Gas box
500: Tank
600: Controller
700: Processing chamber
800: Exhaust pump
991A: open-close valve
991B: Regulator
991C: Pressure gauge
991D: open-close valve
991E: Mass flow controller
992: Flow path block
993: Introduction tube
1000: Semiconductor manufacturing equipment
A1: Opening direction
A2: closing direction
BS: base plate
C1: Cylinder chamber
C2: Cylinder chamber
CP: closed position
Ch: flow passage
Cp: Capacitor
Ct: central line
G: Operating gas
G1: Longitudinal direction (upstream)
G2: Longitudinal direction (downstream)
K: gain
L0: overall length
Lf: Lift amount
OP: open position
OR: O-ring
SP: space
ST1: Steps
ST2: Steps
ST3: Steps
ST4: Steps
ST5: Steps
ST6: Steps
V0: predetermined voltage
Va: applied voltage
Vc: Control voltage
Vc': Control voltage
Vp: Voltage source (voltage signal)
Vs: sensor voltage
Vs0: sensor voltages W1, W2: Width direction
h1: Ventilation channel
ΔV: Deviation

The invention claimed is:

1. A valve device comprising:
a valve body defining a flow path;
a valve element provided so as to be configured to open and close the flow path of the valve body; and
an operator structure provided movably between a close position to make the valve element close the flow path and an open position to make the valve element open the flow path to operate the valve element,
wherein the valve device comprises an adjusting actuator using a piezoelectric element to adjust the position of the operator structure positioned at the open position,
a drive circuit of the adjusting actuator including
a detecting circuit that extracts a value proportional to an electric signal related to an amount of strain generated in the piezoelectric element contained in a voltage difference between both terminals of the piezoelectric element, and
a controller configured to control the adjusting actuator so that an opening degree of the flow path by the valve element becomes a target opening degree based on the value, wherein
the controller is configured to apply a control voltage to the detecting circuit to drive the piezoelectric element to adjust the position of the operator structure through an applied voltage that the detecting circuit applies to the piezoelectric element.

2. The valve device of claim 1, further comprising a main actuator to move the operator structure to one of the open and close positions, and
a spring mechanism to move the operator structure to the other of the open position and the close positions,
wherein the adjusting actuator adjusts a position of the operator structure positioned in the open position by the main actuator or the spring mechanism.

3. A flow rate adjusting method of using the valve device as claimed in claim 1, comprising:
extracting, in the drive circuit of the adjusting actuator, the value proportional to the electric signal related to the amount of strain generated in the piezoelectric element contained in the voltage difference between both terminals of the piezoelectric element; and
controlling the adjusting actuator such that the opening degree of the flow path by the valve body becomes the target opening degree based on the value.

4. A flow rate adjusting method of using the valve device as claimed in claim 2, comprising:
driving the main actuator to make the valve element open the flow path;
applying a control voltage preset for an adjustment operation to the piezoelectric element;
extracting the value proportional to the electric signal related to the amount of strain generated in the piezoelectric element contained in the voltage difference between both terminals of the piezoelectric element to which the control voltage is applied;
determining an opening adjustment amount based on the value; and
inputting a control signal corresponding to the opening adjustment amount to the adjusting actuator.

* * * * *